(12) United States Patent
Miura

(10) Patent No.: US 10,660,237 B2
(45) Date of Patent: May 19, 2020

(54) POWER SUPPLY APPARATUS

(71) Applicant: TOYOTA JIDOSHA KABUSHIKI KAISHA, Toyota-shi (JP)

(72) Inventor: Mitsuhiro Miura, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/978,516

(22) Filed: May 14, 2018

(65) Prior Publication Data

US 2019/0014690 A1 Jan. 10, 2019

(30) Foreign Application Priority Data

Jul. 10, 2017 (JP) .................................. 2017-134920

(51) Int. Cl.
| | |
|---|---|
| *H05K 7/20* | (2006.01) |
| *H02M 7/00* | (2006.01) |
| *H01M 10/6551* | (2014.01) |
| *H01M 10/0525* | (2010.01) |
| *H01M 10/613* | (2014.01) |
| *H01M 10/655* | (2014.01) |
| *H01M 10/60* | (2014.01) |

(52) U.S. Cl.
CPC .... *H05K 7/20409* (2013.01); *H01M 10/0525* (2013.01); *H01M 10/60* (2015.04); *H01M 10/613* (2015.04); *H01M 10/655* (2015.04); *H01M 10/6551* (2015.04); *H02M 7/003* (2013.01); *H05K 7/209* (2013.01)

(58) Field of Classification Search
CPC . H05K 7/20409; H05K 7/209; H01M 10/613; H01M 10/6551; H01M 10/0525; H02M 7/003
USPC .......................................................... 361/704
See application file for complete search history.

(56) References Cited

U.S. PATENT DOCUMENTS

| | | | | |
|---|---|---|---|---|
| 4,576,857 A * | 3/1986 | Gannett | ............. | C08G 73/1064 156/53 |
| 7,494,251 B1 * | 2/2009 | Kira | ........................ | F21V 29/15 362/294 |
| 8,605,450 B2 * | 12/2013 | Kaneshige | .......... | H01M 2/1072 361/730 |
| 2009/0191453 A1 | 7/2009 | Fujii et al. | | |
| 2009/0258282 A1 * | 10/2009 | Harada | ............... | H01M 10/625 429/61 |

(Continued)

FOREIGN PATENT DOCUMENTS

| | | |
|---|---|---|
| JP | 2009-181737 | 8/2009 |
| JP | 2018-32716 | 3/2018 |
| WO | WO 2016/197566 A1 | 12/2016 |

*Primary Examiner* — Mandeep S Buttar
(74) *Attorney, Agent, or Firm* — Oblon, McClelland, Maier & Neustadt, L.L.P.

(57) ABSTRACT

A power supply apparatus includes a battery cell, a voltage conversion circuit connected to the battery cell, a first housing that fixes the battery cell in a manner to enable heat transfer, a second housing that fixes the voltage conversion circuit in a manner to enable heat transfer, and a low thermal conductive layer interposed between mating surfaces of the first housing and the second housing having a thermal conductivity smaller than a thermal conductivity of the first housing. The battery cell and the voltage conversion circuit are accommodated in an internal space formed by the first housing and the second housing.

7 Claims, 7 Drawing Sheets

(56) References Cited

U.S. PATENT DOCUMENTS

| | | | |
|---|---|---|---|
| 2012/0057316 A1* | 3/2012 | Kaneshige | H01M 2/1072 361/752 |
| 2013/0143074 A1 | 6/2013 | Kim | |
| 2014/0022733 A1* | 1/2014 | Lim | H05K 7/2039 361/718 |
| 2016/0010843 A1* | 1/2016 | Hattori | F21S 41/141 165/185 |
| 2016/0065084 A1* | 3/2016 | Suzuki | H02M 7/003 363/144 |
| 2016/0338228 A1* | 11/2016 | Suzuki | G08G 1/042 |
| 2017/0338521 A1 | 11/2017 | Zhang et al. | |
| 2018/0040864 A1* | 2/2018 | Rejman | H01M 2/105 |
| 2018/0056363 A1 | 3/2018 | Sugiura et al. | |

* cited by examiner

POWER SUPPLY APPARATUS

CROSS REFERENCE TO RELATED APPLICATIONS

This application is based upon and claims the benefit of priority from Japanese patent application No. 2017-134920, filed on Jul. 10, 2017, the disclosure of which is incorporated herein in its entirety by reference.

BACKGROUND

The present disclosure relates to a power supply apparatus.

Recently, a power supply apparatus for supplying power to a motor for making a vehicle travel has been developed. For example, in a power supply apparatus described in Japanese Unexamined Patent Application Publication No. 2009-181737, a battery case that accommodates a plurality of battery cells and an electronic component case that accommodates electronic components used for battery charge and discharge control are separately provided and coupled. In this power supply apparatus, the heat generated from the electronic components is actively transferred to the electronic component case via a thermal conductive sheet to dissipate the heat of the electronic components.

SUMMARY

It is desired to reduce the size and cost of the power supply apparatuses. To this end, the battery cell and electronic components are desirably accommodated in an integrated case instead of accommodating the battery cell and the electronic components in separate cases. In particular, a voltage conversion circuit is desirably accommodated together with the battery cell, considering efficient use of power from the battery cell. However, when a voltage conversion circuit that generates high heat is accommodated together with the battery cell in one accommodating space, the heat generated from the voltage conversion circuit is transferred to the battery cell, which adversely affects the performance of the battery cell.

The present disclosure has been made to solve such a problem. An object of the present disclosure is to provide a power supply apparatus that achieves a structure in which a voltage conversion circuit is accommodated together with a battery cell in one accommodating space to thereby reduce a size of the power supply apparatus and in which heat generated from a voltage conversion circuit is hard to be transferred to the battery cell.

An example aspect of the present disclosure is a power supply apparatus including: a battery cell; a voltage conversion circuit connected to the battery cell; a first housing that fixes the battery cell in a manner to enable heat transfer; a second housing that fixes the voltage conversion circuit in a manner to enable heat transfer; and a low thermal conductive layer interposed between mating surfaces of the first housing and the second housing having a thermal conductivity smaller than a thermal conductivity of the first housing. The battery cell and the voltage conversion circuit are accommodated in an internal space formed by the first housing and the second housing.

With such a structure, the heat generated in the voltage conversion circuit can be easily dissipated from the second housing, and at the same time, the heat is blocked by the low thermal conductive layer and is hard for it to be transferred to the first housing. This enables the temperature of the battery cell to be kept low and allows the battery cell to fully exhibit its performance.

In the above power supply apparatus, the low thermal conductive layer may be provided to cover the mating surface and at least a part of a surface other than the mating surface in a surface of one of the first housing and the second housing. A material having a relatively high heat transfer coefficient to air is used as the low thermal conductive layer, an effect of promoting heat dissipation from the housing can be expected.

One of the first housing and the second housing provided with the low thermal conductive film may include heat dissipation fins, and the low thermal conductive layer may be provided to cover the heat dissipation fins. Such a configuration can further improve heat dissipation characteristics. When the low thermal conductive layer is formed as a film, it is possible to reduce the size of the vicinity of the mating surfaces while maintaining the effect of blocking heat.

Further, the voltage conversion circuit may include at least one of a DC/DC converter circuit, an AC/DC converter circuit, a DC/AC inverter circuit, and an AC/AC inverter circuit. These circuits generate a lot of heat, and thus a great effect can be expected from the above configuration.

The present disclosure provides a power supply apparatus that achieves a structure in which a voltage conversion circuit is accommodated together with a battery cell in one accommodating space to thereby reduce a size of the power supply apparatus and in which heat generated from a voltage conversion circuit is hard to be transferred to the battery cell.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Hereinafter, the present disclosure will be described through embodiments of the present disclosure, but the present disclosure according to the claims is not limited to the following embodiments. Further, all of the configurations described in the embodiments are not necessarily indispensable as means for solving the problem.

Figure 1:
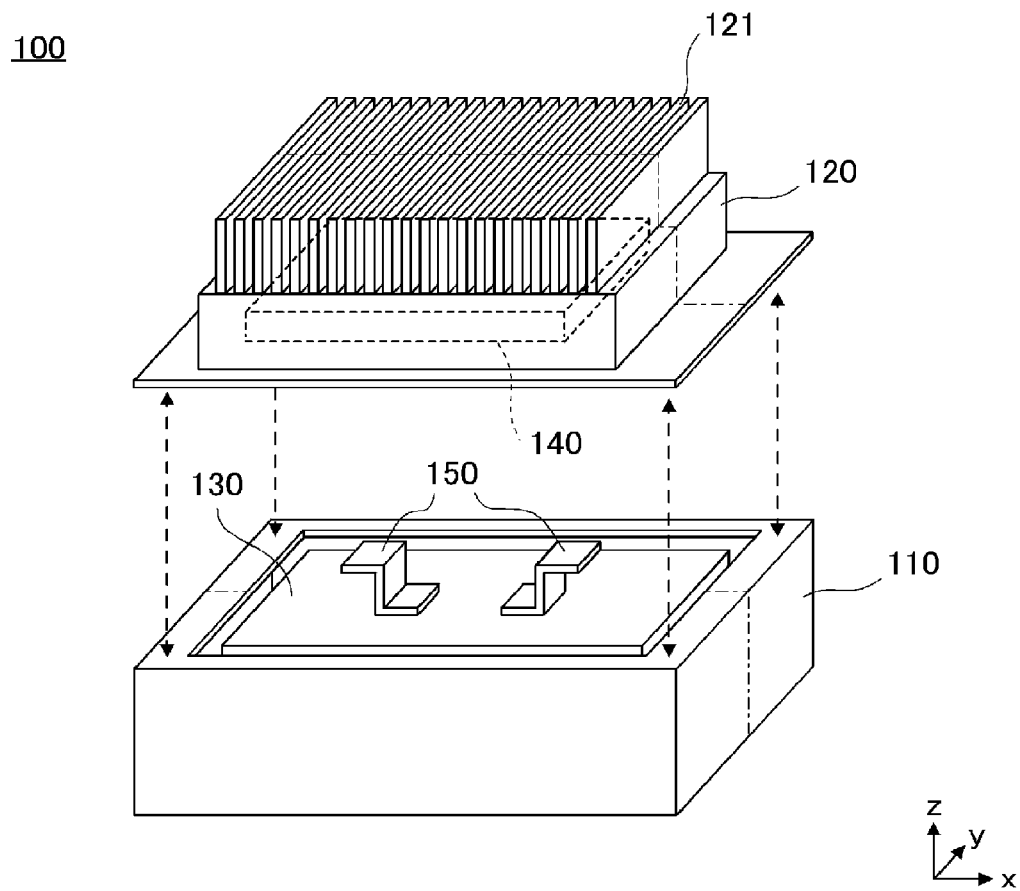
FIG. 1 is an exploded perspective view of a power supply apparatus according to an embodiment.

FIG. 1 is an exploded perspective view of a power supply apparatus 100 according to this embodiment. The power supply apparatus 100 includes a first housing 110 and a second housing 120 that are assembled one above the other. The first housing 110 is a box-shaped case whose upper surface opens. The second housing 120 a box-shaped case whose lower surface opens. The power supply apparatus 100 functions as one power supply as a whole. In this embodiment, as shown in the drawings, a horizontal plane is represented by an xy plane, and a z axis positive direction is upward along a vertical axis. In the following drawings, the directions are indicated by this coordinate system.

The first housing 110 is formed by die casting or pressing using, for example, aluminum as a material. An internal space of the first housing 110 is used as a space for accommodating a battery cell 130. The battery cell 130 is, for example, a lithium-ion battery, and may be a block battery cell including a plurality of battery cells coupled to one another.

The second housing 120 is formed by die casting or pressing using, for example, aluminum as a material. The second housing 120 includes heat dissipation fins 121 on its upper surface. The heat dissipation fins 121 may be provided integrally with the second housing 120, or may be formed separately from the second housing and fixed to the second housing 120. The internal space of the second housing 120 is used as an accommodating space for accommodating the voltage conversion circuit 140. The voltage conversion circuit 140 is a circuit that adjusts an output voltage of the battery cell 130, converts it into a predetermined constant voltage, and outputs the converted voltage. The power supply apparatus 100 supplies power to an external device based on the adjusted voltage.

The busbars 150 are conductors that connect the battery cell 130 to the voltage conversion circuit 140. When the first housing 110 and the second housing 120 are overlapped and integrated with each other according to the dashed double-headed arrows, the busbars 150 are connected to the voltage conversion circuit 140, and the power of the battery cell 130 is supplied to the voltage conversion circuit 140 via the busbars 150.

Figure 2:
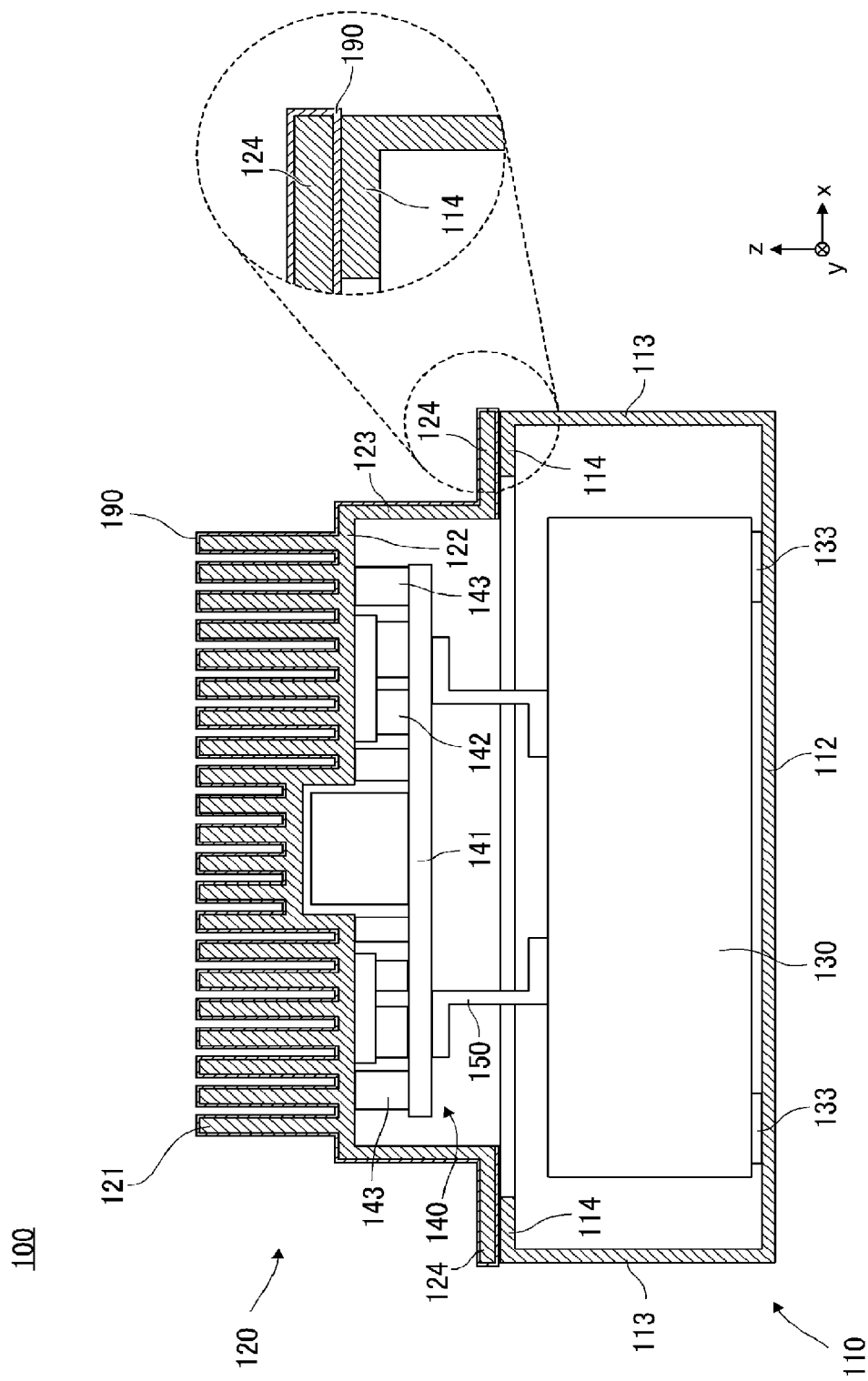
FIG. 2 is a cross-sectional view and a partial enlarged view of the power supply apparatus.

FIG. 2 is a cross-sectional view and a partial enlarged view of the power supply apparatus 100. Specifically, FIG. 2 shows a state in which the first housing 110 and the second housing 120 (including the heat dissipation fins 121) are cut along the long dashed short dashed line in FIG. 1 and a state where the vicinity of mating surfaces is enlarged.

The first housing 110 includes a bottom plate part 112 forming a bottom surface, a body part 113 forming an outer peripheral surface, and a flange part 114 functioning as the surface mating with the second housing 120. The internal space of the first housing 110 is a space surrounded by the bottom plate part 112 and the body part 113. The battery cell 130 accommodated in the internal space is fixed to the bottom plate part 112 by fixing parts 133. The fixing parts 133 have a heat transfer function of letting heat generated in the battery cell 130 escape to the first housing 110. That is, the fixing parts 133 are fixtures made of a material having excellent heat transferability such as copper. Thus, the first housing 110 has a function of dissipating the heat generated in the battery cell 130 to the outside air via the fixing parts 133. The flange part 114 is an outer edge of an opening communicating with the internal space of the second housing 120. The flange part 114 has a shape slightly protruding inward from an end of the body part 113 in parallel with the bottom plate part 112.

In addition to the heat dissipation fins 121, the second housing 120 includes a top plate part 122 forming the upper surface, a body part 123 forming an outer peripheral surface, and a flange part 124 functioning as the surface mating with the first housing 110. The internal space of the second housing 120 is a space surrounded by the top plate part 122 and the body part 123. The voltage conversion circuit 140 accommodated in the internal space includes a substrate part 141, a DC/DC converter 142, and fixing parts 143. The DC/DC converter 142 is mounted on the substrate part 141, and the substrate part 141 is fixed to the top plate part 122 by the fixing parts 143. The fixing parts 143 have a heat transfer function of letting the heat generated in the DC/DC converter 142 escape to the second housing 120. That is, the fixing parts 143 are fixtures made of a material having excellent heat transferability such as copper. Therefore, the second housing 120 and the heat dissipation fins 121 integrally formed with the second housing 120 serve to dissipate the heat generated in the DC/DC converter 142 to the outside air via the fixing parts 143. The flange part 124 is an outer edge of an opening communicating with the internal space of the first housing 110. The flange part 124 has a shape slightly protruding outward from an end of the body part 123 in parallel with the top plate part 122.

A surface of the second housing 120 other than an inner surface facing the internal space is coated with a low thermal conductive film 190, which is a film. The low thermal conductive film 190 is formed of a material having a relatively large heat transfer coefficient for transferring heat to contacting air and having a low thermal conductivity for transferring heat inside the material. In particular, in this example, a material having a thermal conductivity lower than that of aluminum, which is the material of the first housing 110, is employed. For example, a material formed of polyimide or polyimide amide is used.

As shown in a partial enlarged view, the flange part 114 of the first housing 110 and the flange part 124 of the second housing 120 sandwich the low thermal conductive film 190 provided on the flange part 124, and are overlapped and fixed to each other. Then, the first housing 110 and the second housing 120 are integrated to form one accommodating space inside. Regarding heat transfer, the housing integrated in this way is separated by the low thermal conductive film 190 sandwiched between the first housing 110 side and the second housing 120 side. Thus, it is hard for the heat on the second housing 120 side to be transferred to the first housing 110 side. That is, the low thermal conductive film 190 having a thermal conductivity smaller than the thermal conductivity of the material of the second housing 120 interposed between the mating surfaces of the first housing 110 and the second housing 120 makes it hard for the heat on the second housing 120 side to be transferred to the first housing 110 side.

In addition, as the surface of the body part 123 of the second housing 120 and the surface of the heat dissipation fins 121 are also coated with the low thermal conductive film 190, the heat generated in the DC/DC converter 142 effectively dissipates from these surfaces into the outside air. This makes it even harder for the heat on the second housing 120 side to be transferred to the first housing 110. That is, it is possible to achieve the structure in which it is hard for the heat generated by the voltage conversion circuit 140 to be transferred to the battery cell 130 while the battery cell 130 and the voltage conversion circuit 140 are accommodated in one internal space. This enables a reduction in the size of the power supply apparatus 100 as a whole.

The thickness of the low thermal conductive film 190 may be determined by taking the thermal conductivity of the low thermal conductive film 190, the heat generation amount of the voltage conversion circuit 140, the heat capacity and the heat dissipation amount of the entire second housing 120 including the heat dissipation fins 121 per unit time into consideration. For example, when an upper limit allowable temperature of the battery cell 130 is 60° C., the thickness of the low thermal conductive film 190 may be determined so that the surface of the low thermal conductive film 190 contacting the flange part 124 does not reach 60° C. while the voltage conversion circuit 140 is used.

Figure 3:
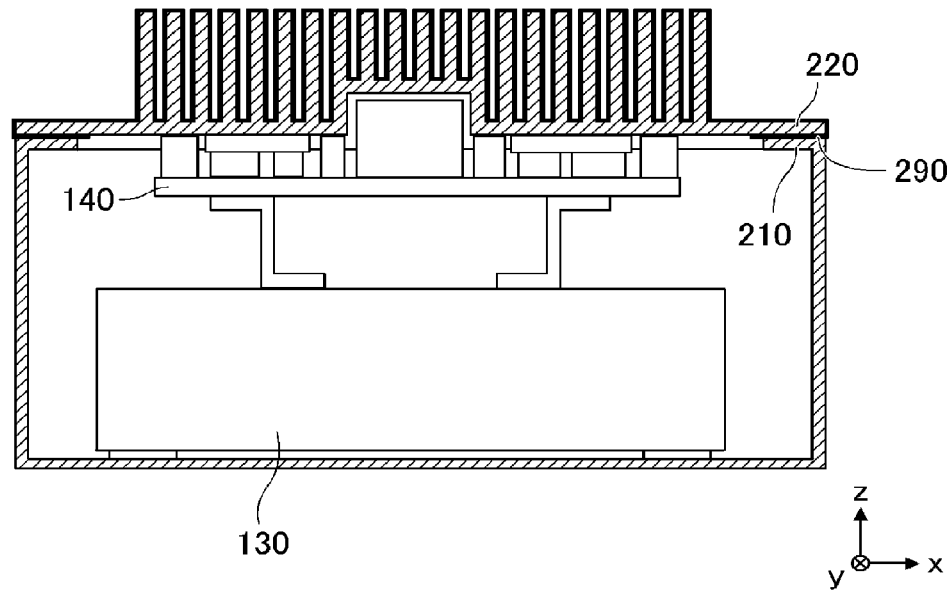
FIG. 3 is a cross-sectional view of a power supply apparatus according to another embodiment.

FIG. 3 is a cross-sectional view of a power supply apparatus 200 according to another embodiment. Structures of the housings of the power supply apparatus 200 are slightly different from those of the housings of the power supply apparatus 100. As the elements of these apparatuses other than the housings are the same, descriptions thereof will be omitted.

In the power supply apparatus 200, the first housing 210, which is a box-shaped case, forms an internal space, and the second housing 220 is a lid-shaped case that covers an opening of the first housing 210. Like the power supply apparatus 100, the battery cell 130 is fixed to the first housing 210, and the voltage conversion circuit 140 is fixed to the second housing 220. However, both the battery cell 130 and the voltage conversion circuit 140 are substantially accommodated in the first housing 210.

A low thermal conductive film 290 interposed between the mating surfaces of the first housing 210 and the second housing 220 as described above can effectively prevent the heat generated by the voltage conversion circuit 140 from traveling through both housings to thereby heat the battery cells 130. That is, the heat generated by the voltage conversion circuit 140 is effectively dissipated on the second housing 220 side and is effectively blocked by the low thermal conductive film 290 interposed between the mating surfaces. Thus, like the power supply apparatus 100, the power supply apparatus 200 can also be reduced in size as a whole.

Figure 4:
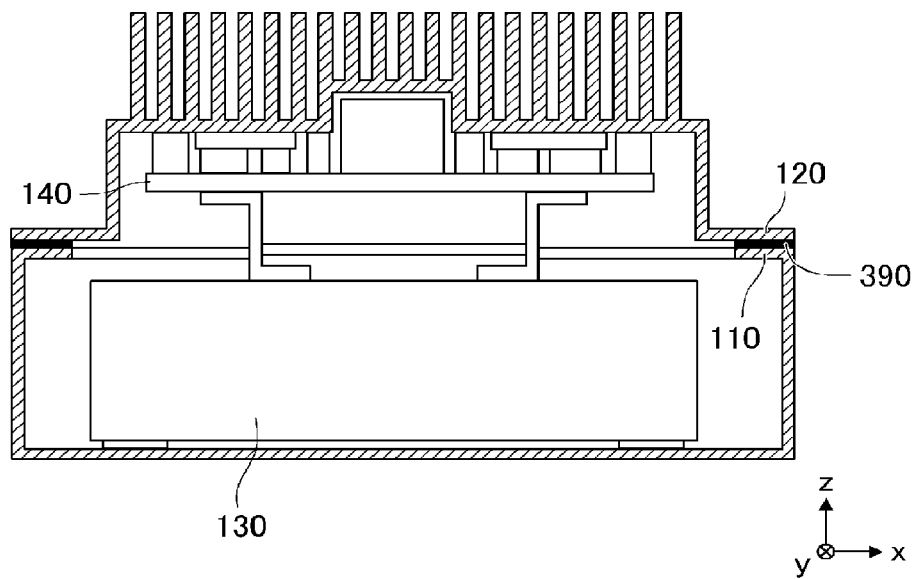
FIG. 4 is a cross-sectional view of a power supply apparatus according to still another embodiment.

FIG. 4 is a cross-sectional view of a power supply apparatus 300 according to still another embodiment. Structures of housings of the power supply apparatus 300 are the same as those of the housings of the power supply apparatus 100 except that in the power supply apparatus 300, the low thermal conductive layer is a sheet, not a film. As the elements of these apparatuses other than the low thermal conductive layer are the same, descriptions thereof will be omitted.

In the power supply apparatus 100, the low thermal conductive film 190 is coated on the surface of the second housing 120 other than the inner surface facing the internal space. However, in the power supply apparatus 300, a low thermal conductive sheet 390 is interposed between the mating surfaces of the first housing 110 and the second housing 220 instead of applying the coating to the second housing 120. Like the low thermal conductive film 190, a material having a thermal conductivity lower than that of aluminum, which is the material of the first housing 110, is used for the low thermal conductive sheet 390. For example, a sheet formed of polyimide or polyimide amide is used.

The low thermal conductive sheet 390 interposed between the mating surfaces of the first housing 110 and the second housing 120 as described above can effectively prevent the heat generated by the voltage conversion circuit 140 from traveling through both housings to thereby heat the battery cells 130. That is, the heat generated by the voltage conversion circuit 140 is effectively dissipated on the second housing 120 side and is effectively blocked by the low thermal conductive sheet 390 interposed between the mating surfaces. Thus, like the power supply apparatus 100, the power supply apparatus 300 can also be reduced in size as a whole. Note that a material having a relatively high heat transfer coefficient may be coated on the heat dissipation fins 121 or the like. In this case, the material may not be the same as the material of the low thermal conductive sheet 390.

Figure 5:
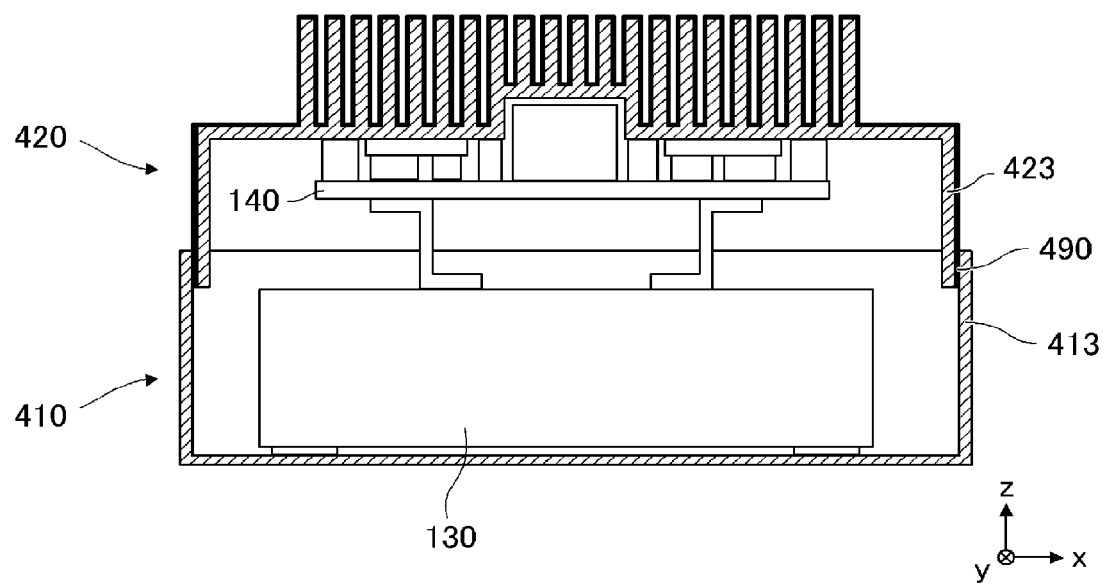
FIG. 5 is a cross-sectional view of the power supply apparatus according to still another embodiment.

FIG. 5 is a cross-sectional view of a power supply apparatus 400 according to still another embodiment. Structures of the housings of the power supply apparatus 400 are slightly different from those of the power supply apparatus 100. As the elements of these apparatuses other than the low thermal conductive layer are the same, descriptions thereof will be omitted.

In the power supply apparatus 400, neither the first housing 410 nor the second housing 420 has the flange part as described above. A low thermal conductive film 490 is interposed between mating surfaces of the first housing 410 and the second housing 420. The mating surface of the first housing 410 is near an upper end of a body part 413. The mating surface of the second housing 420 is near a lower end of a body part 423. Like the power supply apparatus 100, the low thermal conductive film 490 is coated on the surface of the second housing 420 other than the inner surface facing the internal space.

A low thermal conductive film 490 interposed between the mating surfaces of the first housing 410 and the second housing 420 as described above can effectively prevent the heat generated by the voltage conversion circuit 140 from traveling through both housings to thereby heat the battery cells 130. That is, the heat generated by the voltage conversion circuit 140 is effectively dissipated on the second housing 420 side and is effectively blocked by the low thermal conductive film 490 interposed between the mating surfaces. Thus, like the power supply apparatus 100, the power supply apparatus 400 can also be reduced in size as a whole. Instead of the low thermal conductive film 490, a low thermal conductive sheet may be interposed between the mating surfaces like the power supply apparatus 300.

Figure 6:
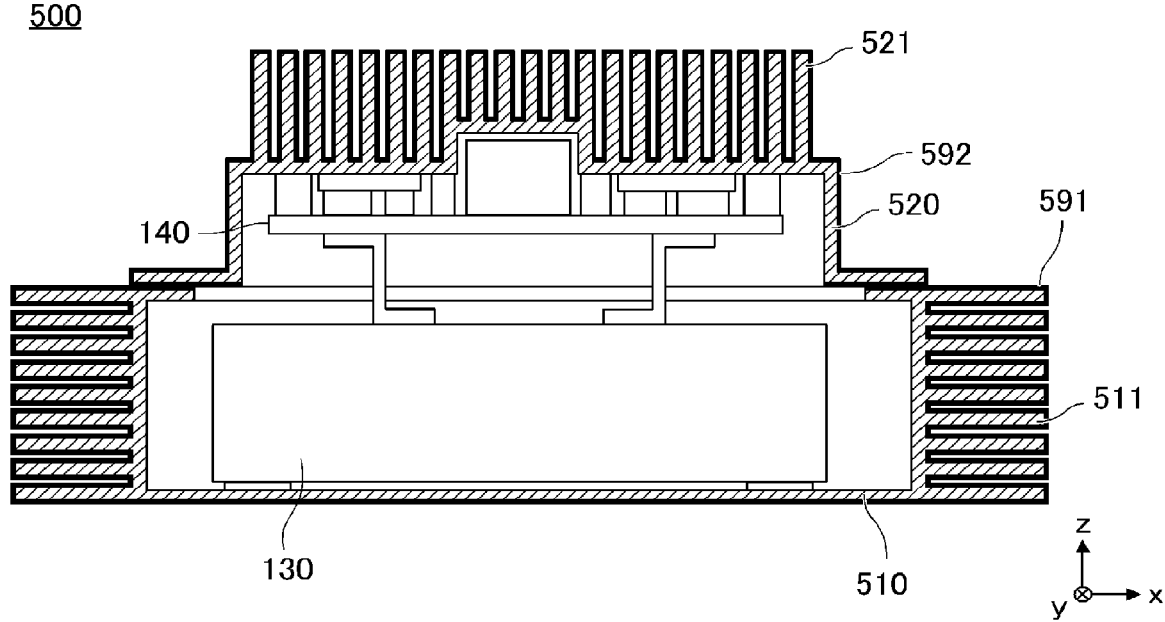
FIG. 6 is a cross-sectional view of the power supply apparatus according to still another embodiment.

FIG. 6 is a cross-sectional view of a power supply apparatus 500 according to still another embodiment. Structures of the housings of the power supply apparatus 500 are slightly different from those of the power supply apparatus 100. As the elements of these apparatuses other than the low thermal conductive layer are the same, descriptions thereof will be omitted.

Like the second housing 120 of the power supply apparatus 100, the power supply apparatus 500 includes a second housing 520 having the heat dissipation fins 521 and coated with a low thermal conductive film 592. Unlike the first housing 110 of the power supply apparatus 100, the power supply apparatus 500 includes a first housing 510 having the heat dissipation fins 511 and coated with a low thermal conductive film 591. The low thermal conductive film 591 is coated on the surface of the first housing 510 other than the inner surface facing the internal space.

Improvement in the heat dissipation performance of the first housing 510 in the manner described above enables the heat generated in the battery cell 130, which could get high, to be sufficiently dissipated within the first housing 510. Therefore, in addition to the function of the low thermal conductive film interposed between the mating surfaces being provided, contrary to the above example, in this example, it is possible to reduce the heat generated by the battery cell 130 to be transferred to the voltage conversion circuit 140 side.

In the above example, two layers, which are the low thermal conductive film 591 on the side of the first housing 510 and the low thermal conductive film 592 on the side of the second housing 520, are interposed between the mating surfaces of the first housing 510 and the second housing 520. Alternatively, only one of the surfaces of the first housing 510 and the second housing 520 may be coated with a low thermal conductive film. In a further alternative, none of the housings may be coated with a low thermal conductive film, and a low thermal conductive sheet may be interposed between the mating surfaces, like the power supply apparatus 300.

Figure 7:
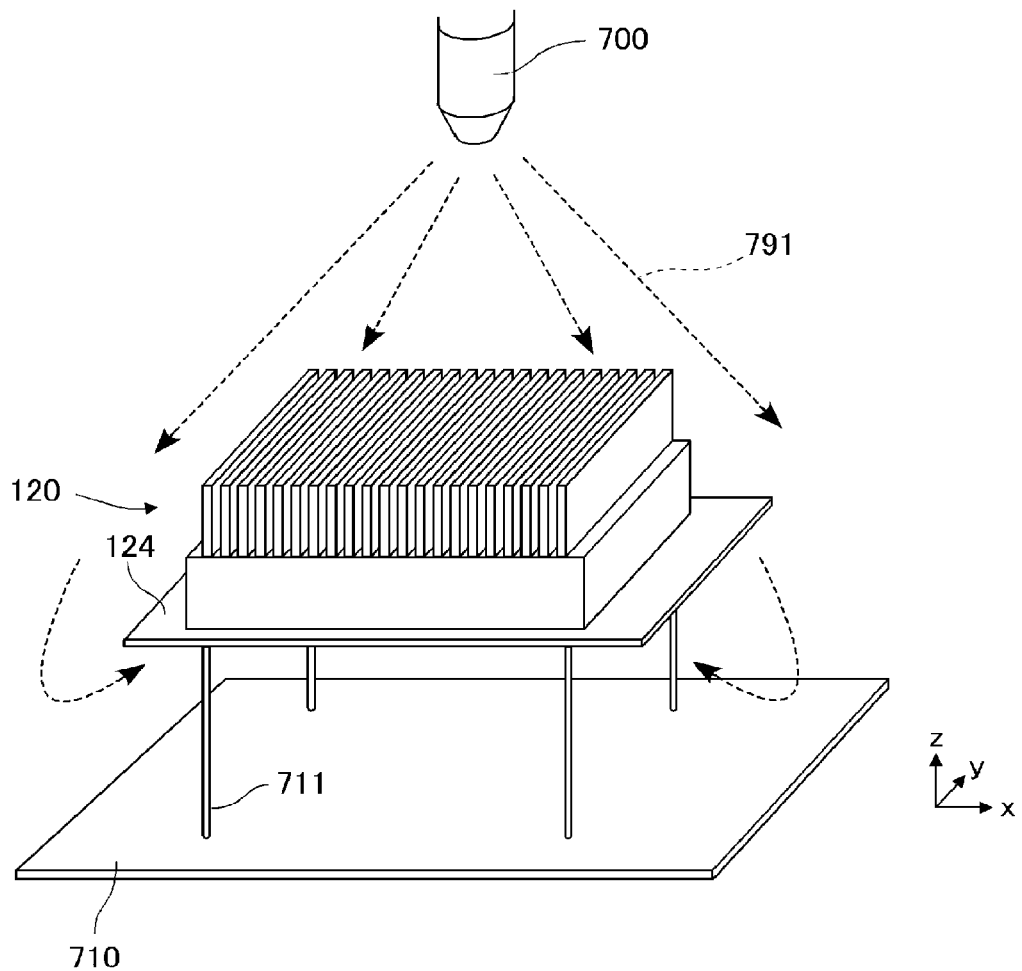
FIG. 7 is an explanatory diagram describing a method of forming a low thermal conductive film.

Next, an example of a method of forming a low thermal conductive film and a low thermal conductive sheet will be described. FIG. 7 is an explanatory diagram describing the method of forming the low thermal conductive film 190 on the second housing 120 of the power supply apparatus 100.

A spray nozzle 700 is provided above a working area. A work table 710 is provided on a floor surface of the working area. The second housing 120 is placed on a plurality of support pins 711 standing on the work table 710.

The spray nozzle 700 sprays, for example, a spray liquid 791 containing polyimide amide as a main component toward the second housing 120. At this time, as the second housing 120 is supported almost in the air, the spray liquid 791 turns into mist and reaches a rear side of the flange part 124. Thus, the spray liquid 791 adheres to the surface of the second housing 120 other than the inner surface substantially facing the internal space. After that, when the second housing 120 is dried, it is finished with the low thermal conductive film 190 coated thereon.

Figure 8A:
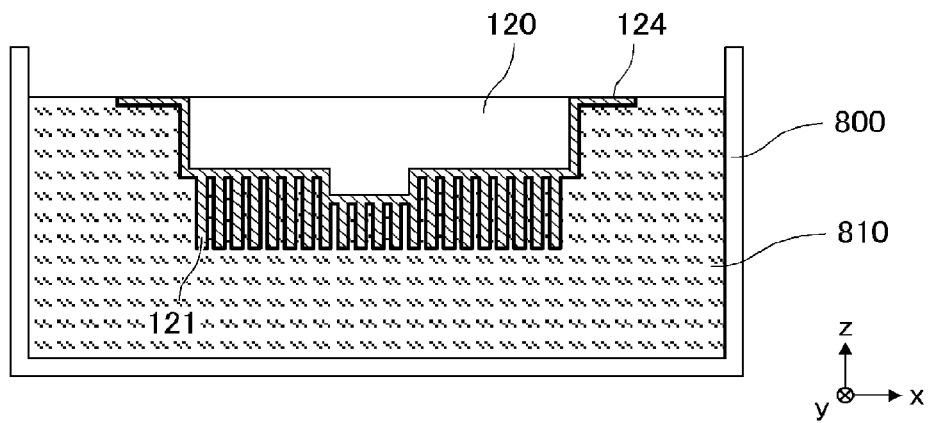
FIG. 8A is an explanatory diagram describing another method of forming a low thermal conductive film.
Figure 8B:
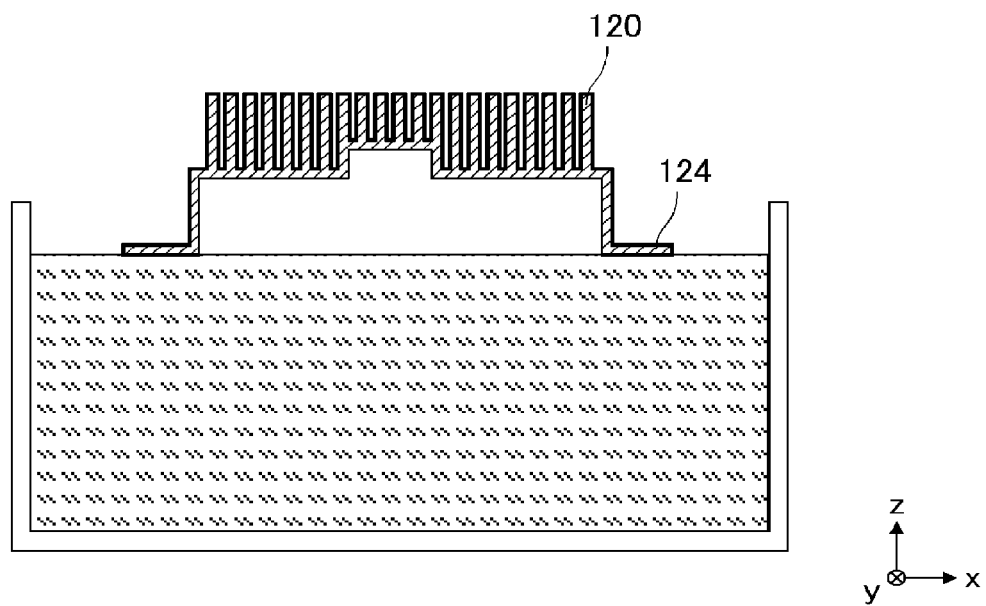
FIG. 8B is an explanatory diagram describing still another method of forming the low thermal conductive film.

FIGS. 8A and 8B are explanatory diagrams describing another method of forming the low thermal conductive film 190 on the second housing 120 of the power supply apparatus 100. This method is a coating method by so-called dipping.

As shown in FIG. 8A, a dipping bath 800 is filled with, for example, a coating liquid 810 containing polyimide amide as a main component. Then, the second housing 120 is dipped into the coating liquid 810 with the heat dissipation fins 121 facing downward until the flange part 124 reaches a level of the liquid surface of the coating liquid 810.

After that, as shown in FIG. 8B, the second housing 120 is dipped into the coating liquid 810 with the heat dissipation fins 121 facing upward until the flange part 124 reaches the level of the liquid surface of the coating liquid 810. By this two-step processing, the coating liquid 810 can adhere to the surface of the second housing 120 other than the inner surface facing the internal space. After that, when it is dried, the second housing 120 is finished in a state where the low thermal conductive film 190 is coated.

Figure 9A:
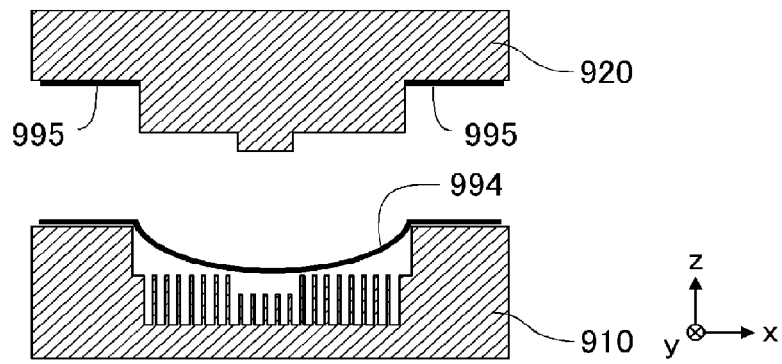
FIG. 9A is an explanatory diagram describing a method of attaching the low thermal conductive sheet.
Figure 9B:
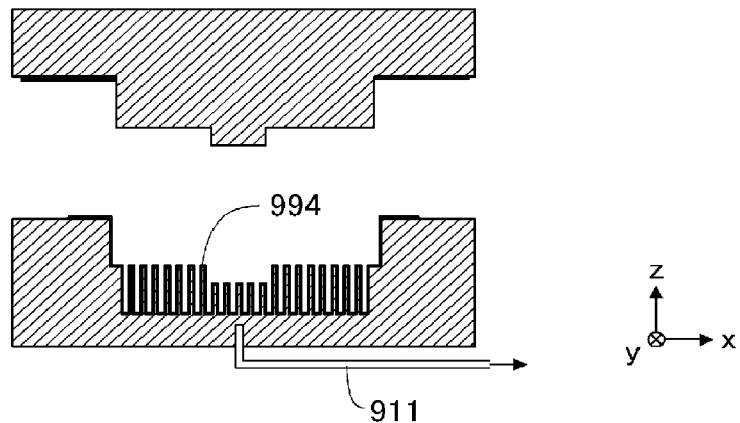
FIG. 9B is an explanatory diagram describing the method of attaching the low thermal conductive sheet.
Figure 9C:
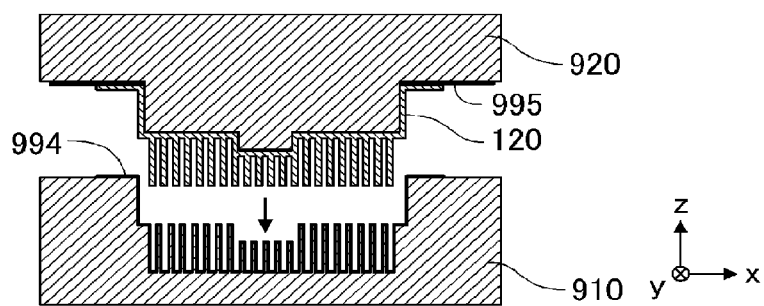
FIG. 9C is an explanatory diagram describing the method of attaching the low thermal conductive sheet.

FIGS. 9A to 9C are explanatory diagrams describing a method of attaching a low thermal conductive sheet to the second housing 120 of the power supply apparatus 100. Firstly, as a first step, as shown in FIG. 9A, a first low thermal conductive sheet 994 and a second low thermal conductive sheet 995 are placed on a lower mold 910 and an upper mold 920, respectively, that correspond to the shape of the second housing 120. The first low thermal conductive sheet 994 has a sufficient size to cover a cavity of the lower mold 910.

Next, as a second step, as shown in FIG. 9B, evacuation is performed by a suction pipe 911 provided in the lower mold 910, and the first low thermal conductive sheet 994 is brought into tight contact with the lower mold 910 corresponding to the shape of the lower mold 910. Then, as a third step, as shown in FIG. 9C, the second housing 120 is placed on the upper mold 920, the upper mold 920 is moved toward the lower mold 910, and the second housing 120 is brought into tight contact with the first low thermal conductive sheet 994.

Through these steps, the second housing 120 is removed from the mold while the first low thermal conductive sheet 994 and the second low thermal conductive sheet 995 are in tight contact with the surface of the second housing 120 other than the inner surface facing the internal space. An adhesive may be applied to the surface of each of the low thermal conductive sheets. Further, the second housing 120 may be placed on the upper mold 920 with heat from the die-casting remaining thereon. The use of an adhesive and remaining heat can enhance the adhesion of the low thermal conductive sheet.

The method of forming the low thermal conductive film and the low thermal conductive sheet described with reference to FIGS. 7 to 9C can be applied to each housing described with reference to FIGS. 3 to 6 as appropriate. It is obvious that other methods of forming the low thermal conductive film and the low thermal conductive sheet may be used.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A power supply apparatus comprising:
   a battery cell;
   a voltage conversion circuit connected to the battery cell;
   a first housing that fixes the battery cell in a manner to enable heat transfer;
   a second housing that fixes the voltage conversion circuit in a manner to enable heat transfer; and
   a low thermal conductive layer interposed between mating surfaces of the first housing and the second housing, the low thermal conductive layer having a thermal conductivity smaller than a thermal conductivity of the first housing,
   wherein the battery cell and the voltage conversion circuit are accommodated in an internal space formed integrally by the first housing and the second housing.

2. The power supply apparatus according to claim 1, wherein the low thermal conductive layer is provided to cover the mating surface and at least a part of a surface other than the mating surface in a surface of one of the first housing and the second housing.

3. The power supply apparatus according to claim 2, wherein one of the first housing and the second housing provided with the low thermal conductive film comprises heat dissipation fins, and the low thermal conductive layer is provided to cover the heat dissipation fins.

4. The power supply apparatus according to claim 1, wherein the low thermal conductive layer is a film.

5. The power supply apparatus according to claim 1, wherein the voltage conversion circuit comprises at least one of a DC/DC converter circuit, an AC/DC converter circuit, a DC/AC inverter circuit, and an AC/AC inverter circuit.

6. The power supply apparatus according to claim 1, wherein the mating surface of the first housing and the second housing each include a respective flange part.

7. The power supply apparatus according to claim 6, wherein the flange part of the first housing is an outer edge of an opening communicating with the internal space of the second housing.

* * * * *